Figure 3:
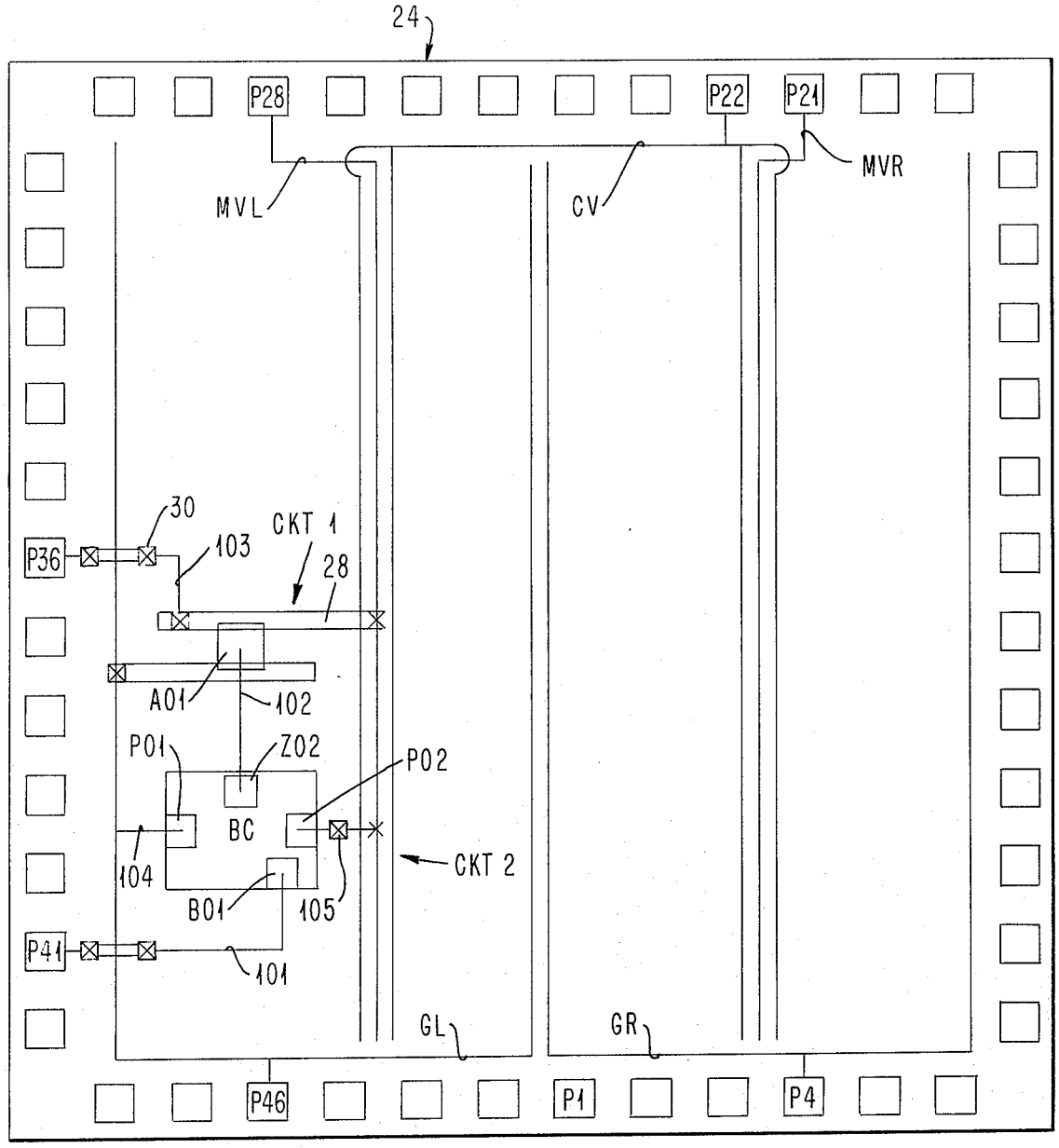
Figure 4:
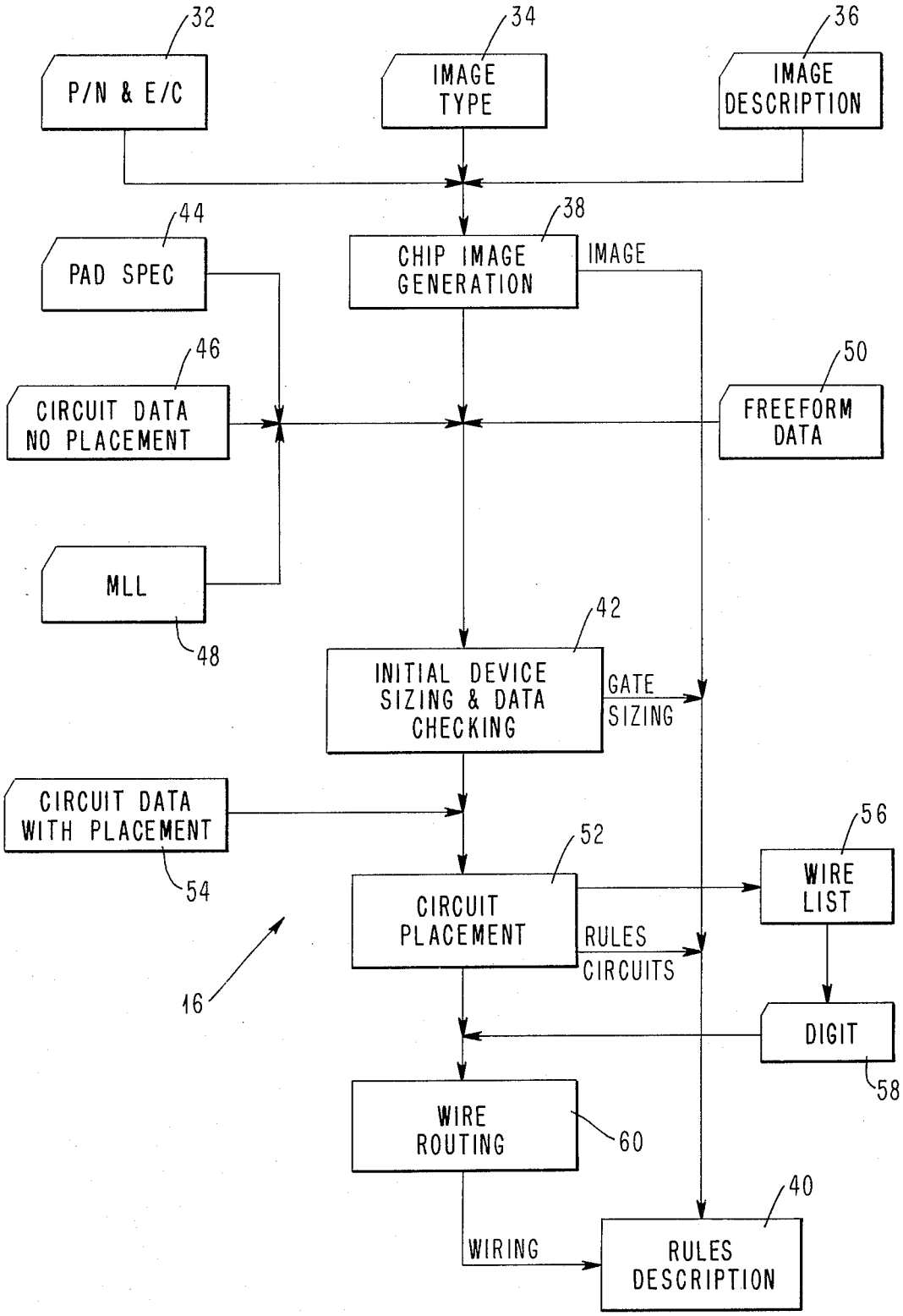
Figure 6:
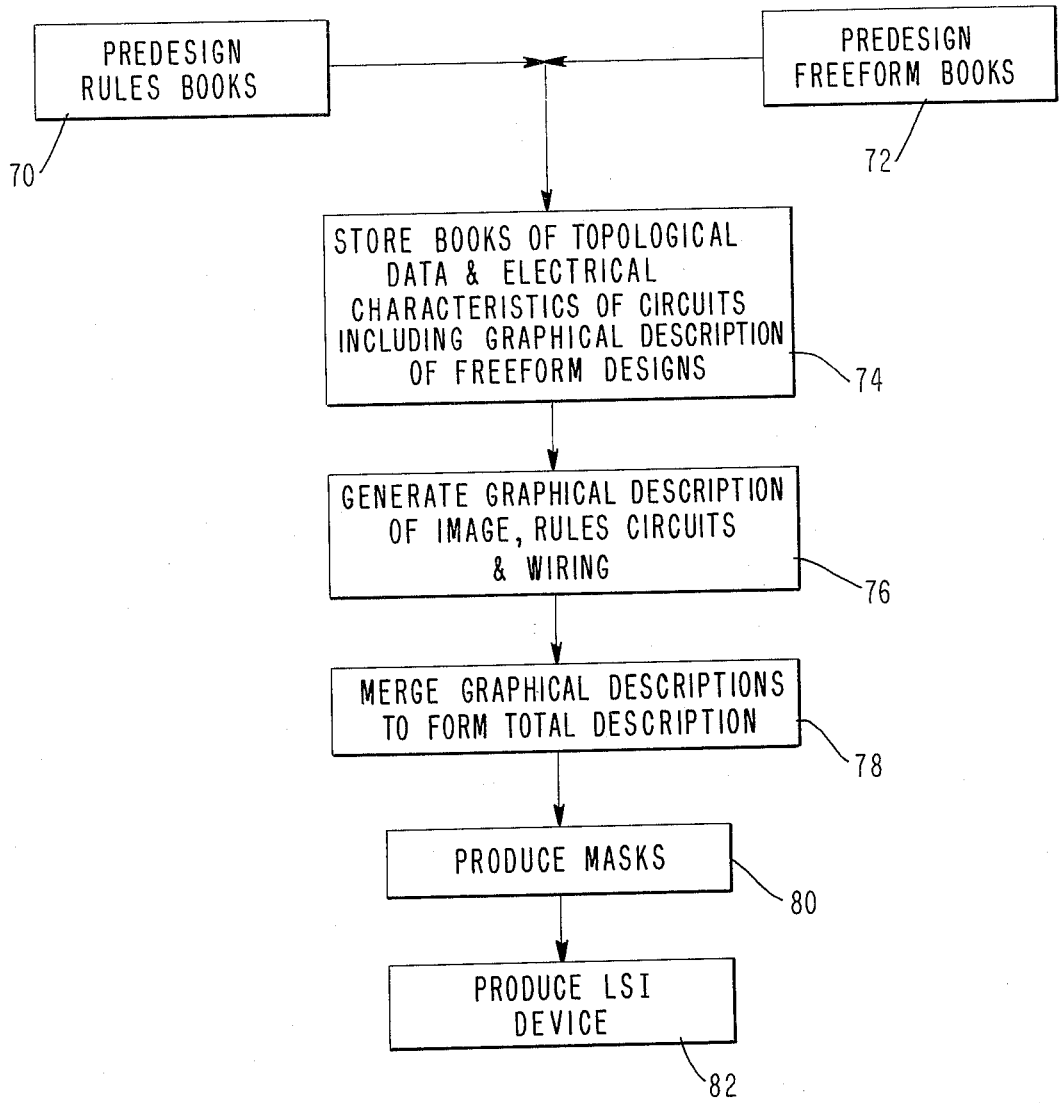

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED SEPTEMBER 2, 1975

938 O.G. 7

T938,005

PROCESS FOR MAKING LSI CHIPS HAVING BOTH RULES DRIVEN AND FREE FORM DESIGN

William F. Colton, Woodbridge, Bela Gogos, Manassas, and William Rosenbluth, Reston, Va., and Douglas H. Rutherford, Severna Park, Md., assignors to International Business Machines Corporation, Armonk, N.Y.

Continuation of abandoned application Ser. No. 401,303, Sept. 27, 1973. This application Aug. 28, 1974, Ser. No. 501,320

Int. Cl. G06f *15/20*
U.S. Cl. 444—1
6 Sheets Drawing. 11 Pages Specification

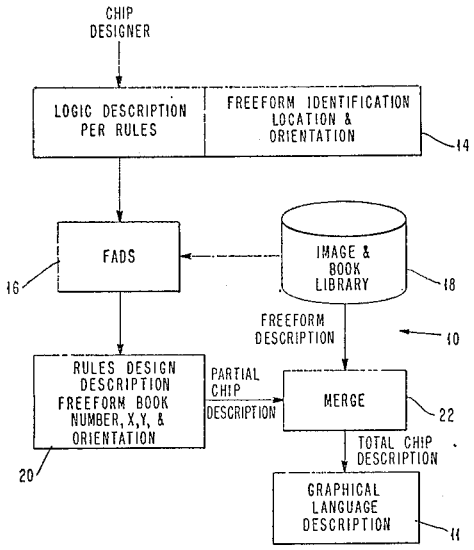

Stored in a design automation (DA) system is a library of predesigned graphical descriptions that describe circuits designed by the free form technique. A chip designer would layout a chip including both free form and rules driven portions. An input is fed to the DA system which specifies the rules driven design in the established manner and specifies the free form design by defining the library description thereof, and the relative placement of the design on the chip. The system in response to such input generates a graphical description of the rules driven design without doing any automatic checking of the internals of the free form design. The generated description or topology is then merged with the free form description or topology from the library to form a complete chip description from which is derived data for making the masks.

FIG. 1 PRIOR ART & INVENTION
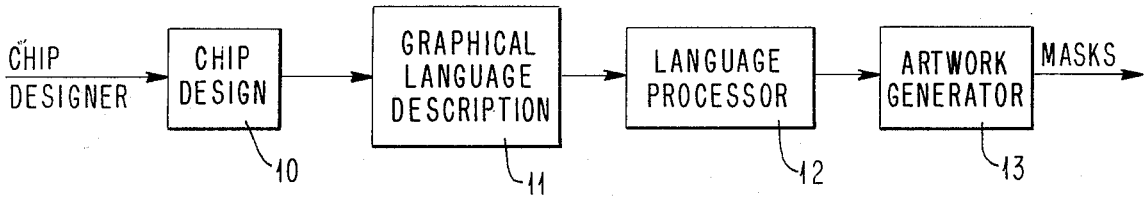
FIG. 2
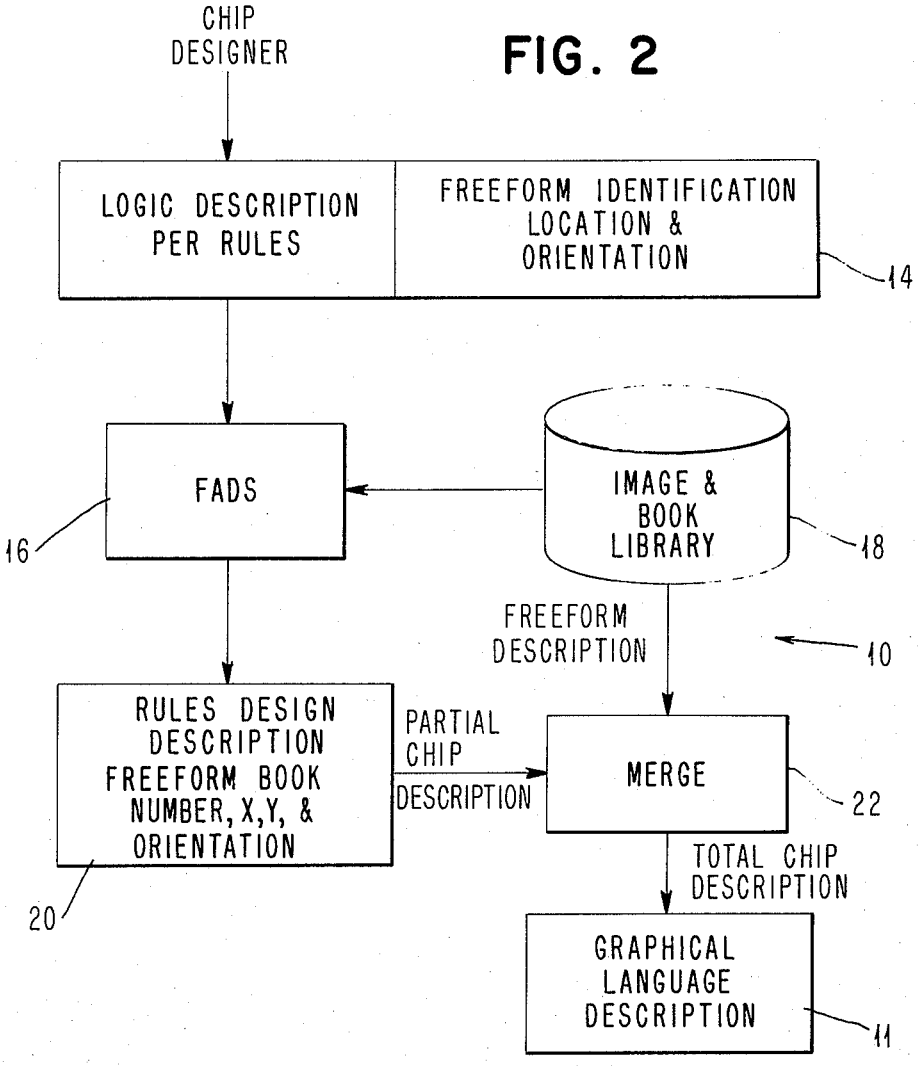

FIG. 5d

44

| LOGICAL I/O | PHYSICAL I/O | WAVEFORM | RISE TIME | FALL TIME | CAPACITANCE |
|---|---|---|---|---|---|
| P41 | P41 | | 100 | 200 | |
| P36 | P36 | | | | 5 |

PAD DATA

FIG. 5e

58

| NET NUMBER | CODE | X START | Y START | Z START | WIDTH | DIRECTION | STEPS |
|---|---|---|---|---|---|---|---|
| 101 | 1 | a | b | c | o | | |
| 102 | 1 | d | e | f | o | | |
| 103 | 1 | s | n | i | o | | |

DIGIT DATA

FIG. 5f

34

| DEFAULT IMAGE | COLUMNS = N |
|---|---|

IMAGE TYPE

FIG. 5a 46 (54)

| CIRCUIT NUMBER | BOOK NUMBER | COLUMN | ROW | ORDER | ORIENTATION | LOAD DEVICE | LOAD WIDTH | FUNCTION | SUB-FUNCTION | SPECIFICATION | SPECIFIED LST | DELAY LST |
|---|---|---|---|---|---|---|---|---|---|---|---|---|
| 1 | 1 | (1) | (2) | (1) | (1) | | | | | | | |

CIRCUIT DATA

FIG. 5b

50

| CIRCUIT NUMBER | BOOK NUMBER | X LOCATION | Y LOCATION | ORIENTATION |
|---|---|---|---|---|
| 2 | 401 | 10 | 50 | 1 |

FREEFORM DATA

FIG. 5c

48

| NET NUMBER | CIRCUIT NUMBER | LST ID | CIRCUIT | LST ID | CIRCUIT | LST ID |
|---|---|---|---|---|---|---|
| 101 | 2 | B01 | -1 | P41 | | |
| 102 | 2 | Z02 | 1 | A01 | | |
| 103 | 1 | Z01 | -101 | P36 | | |

MASTER LOGIC LIST (MLL)